(12) United States Patent
Morishita

(10) Patent No.: US 12,243,617 B2
(45) Date of Patent: Mar. 4, 2025

(54) LOOPBACK CIRCUIT FOR LOW-POWER MEMORY DEVICES

(71) Applicant: Micron Technology, Inc., Boise, ID (US)

(72) Inventor: Yoshihito Morishita, Shibuya-ku (JP)

(73) Assignee: Micron Technology, Inc., Boise, ID (US)

( * ) Notice: Subject to any disclaimer, the term of this patent is extended or adjusted under 35 U.S.C. 154(b) by 193 days.

(21) Appl. No.: 18/051,143

(22) Filed: Oct. 31, 2022

(65) Prior Publication Data

US 2024/0144984 A1    May 2, 2024

(51) Int. Cl.
*G11C 7/10* (2006.01)
*G11C 7/22* (2006.01)

(52) U.S. Cl.
CPC .......... *G11C 7/1084* (2013.01); *G11C 7/1057* (2013.01); *G11C 7/22* (2013.01)

(58) Field of Classification Search
CPC ....... G11C 7/1084; G11C 7/1057; G11C 7/22; G11C 29/028; G11C 29/50008; G11C 7/1087; G11C 7/1093; G11C 7/222; G11C 29/022
USPC ............................................ 365/189.05, 193
See application file for complete search history.

(56) References Cited

U.S. PATENT DOCUMENTS

| | | | | |
|---|---|---|---|---|
| 5,274,670 A * | 12/1993 | Serizawa | .......... | H04L 25/03038 375/233 |
| 6,346,836 B1 * | 2/2002 | Wieberneit | ............... | H04L 7/02 326/97 |
| 6,469,558 B1 * | 10/2002 | Shepston | ............... | H03K 5/133 327/264 |
| 6,601,054 B1 * | 7/2003 | Lo | ............ | G05B 5/01 706/14 |
| 8,340,602 B1 * | 12/2012 | Peiris | .................... | H03F 1/3241 455/114.3 |
| 8,344,978 B2 * | 1/2013 | Kim | ........................ | G09G 3/20 345/89 |
| 8,565,343 B1 * | 10/2013 | Husted | ................. | H04B 1/0475 455/114.3 |
| 9,811,273 B1 * | 11/2017 | Brahmadathan | ...... | G06F 3/0619 |
| 10,659,215 B1 * | 5/2020 | Wang | ................... | G11C 7/1084 |
| 2006/0152267 A1 * | 7/2006 | Ramprasad | ............ | H03K 3/356 327/208 |
| 2008/0225603 A1 * | 9/2008 | Hein | ..................... | G11C 7/1072 365/189.05 |
| 2009/0103443 A1 * | 4/2009 | Ku | .......................... | H04L 1/243 710/104 |
| 2013/0151796 A1 * | 6/2013 | Gupta | ................. | G06F 13/4234 711/E12.001 |
| 2018/0089079 A1 * | 3/2018 | Hansson | ............. | G06F 13/4234 |

(Continued)

FOREIGN PATENT DOCUMENTS

DE       4200667 A1 *   7/1993   ............ G06F 11/277

*Primary Examiner* — Michael T Tran
(74) *Attorney, Agent, or Firm* — Fletcher Yoder, P.C.

(57) ABSTRACT

Devices and methods for operating a low-power memory device includes a first data input (DQ) circuitry including an input buffer configured to generate a loopback data signal based at least in part on a data signal received at the first DQ circuitry when the low-power memory device operates in a feedback mode. A second DQ circuitry includes an output buffer configured to receive the loopback data signal from the first DQ circuitry and to output the loopback data signal via a data pin.

19 Claims, 6 Drawing Sheets

(56) References Cited

U.S. PATENT DOCUMENTS

| | | | |
|---|---|---|---|
| 2018/0136866 A1* | 5/2018 | Eugenio | G06F 11/22 |
| 2018/0278486 A1* | 9/2018 | Mermoud | G06N 5/04 |
| 2019/0079699 A1* | 3/2019 | Lee | G11C 7/22 |
| 2019/0212769 A1* | 7/2019 | Carlough | G06F 13/1689 |
| 2019/0230522 A1* | 7/2019 | Sugaya | B60W 10/20 |
| 2019/0237152 A1* | 8/2019 | Lee | G11C 29/38 |
| 2020/0126609 A1* | 4/2020 | Kim | G06F 3/0604 |
| 2020/0286534 A1* | 9/2020 | Choi | G11C 29/46 |
| 2021/0044283 A1* | 2/2021 | Ryu | H03K 3/356191 |
| 2022/0148639 A1* | 5/2022 | Wu | G11C 29/028 |
| 2022/0190844 A1* | 6/2022 | Rose | H03M 13/09 |
| 2022/0199171 A1* | 6/2022 | Suzuki | G06F 3/0658 |
| 2022/0294428 A1* | 9/2022 | Gomm | H03K 5/01 |
| 2022/0301603 A1* | 9/2022 | Jeon | G11C 29/50012 |
| 2024/0144984 A1* | 5/2024 | Morishita | G11C 29/022 |

* cited by examiner

LOOPBACK CIRCUIT FOR LOW-POWER MEMORY DEVICES

BACKGROUND

Field of the Present Disclosure

Embodiments of the present disclosure relate generally to memory devices. More specifically, embodiments of the present disclosure relate to monitoring operation of a memory device.

Description of Related Art

Generally, a computing system may include electronic devices that, in operation, communicate information via electrical signals. For example, a computing system may include a processor communicatively coupled to a memory device, such as a dynamic random-access memory (DRAM) device, a ferroelectric random-access memory (FeRAM) device, another random-access memory (RAM) device, and/or a hybrid device that incorporates more than one type of RAM. In this manner, the processor may communicate with the memory device, for example, to retrieve executable instructions, retrieve data to be processed, by the processor, and/or store data output from the processor.

To facilitate improving operational reliability, operation of a memory device may be monitored, for example, by a host controller to facilitate debugging operations of the memory device and/or to facilitate performing diagnostics on operation of the memory device. In some instances, operation of a memory device may be monitored based on an analysis of signals indicative of data input to and/or output from the memory device. However, some of types of RAM, such as low-power double-data rate type 5 (LPDDR5) may be unable to perform various monitoring techniques that other types of memory, such non-low-power versions (e.g., DDR5), may utilize.

Embodiments of the present disclosure may be directed to one or more of the problems set forth above.

DETAILED DESCRIPTION

Figure 1:
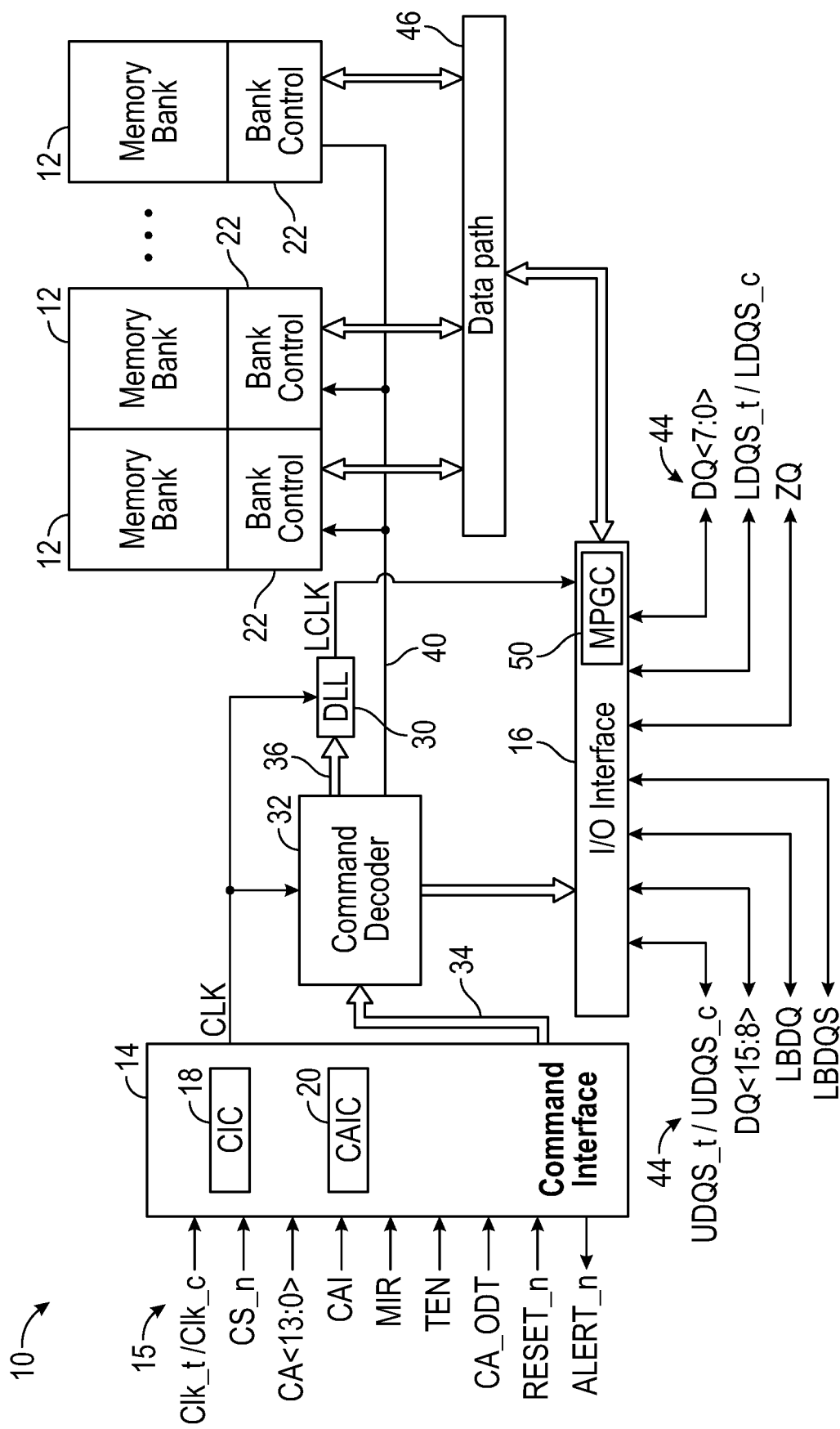
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Generally, a computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, and/or store data output from the processor.

To facilitate monitoring operation of memory, the present disclosure provides techniques for implementing a loopback datapath (e.g., network) between one or more memory devices and/or host devices (e.g., host processors), which enables transmission of a loopback signal indicative of memory device operation. In some embodiments, a memory device may generate a loopback signal based at least in part on a data (e.g., DQ) signal and/or a strobe (e.g., DQS) signal output, for example, to the processor. A host controller may monitor (e.g., debug and/or diagnose) operation of the target memory device through the loopback signal transmitted between the memory device and the host controller via a loopback datapath. In some instances, the host controller is included in and/or replaced by test or characterization equipment used to verify operation or to verify performance of the targeted memory device. For example, the testing may be performed during manufacturing and prior to installation of the targeted memory device in a computing system and/or on a memory module. Additionally or alternatively, the testing may be used for debug purposes in case of a system/device underperforming expectations. A loopback datapath may be implemented to connect multiple memory devices, for example, with a loopback pin on a memory module communicatively coupled to the host controller. Some standards may define at least a portion of how loopback monitoring may be performed. However, such standards may be limited to specific versions of devices that do not apply to other versions (e.g., low-power versions).

Thus, to facilitate memory diagnostics and/or debugging in the other versions, the present disclosure provides techniques to facilitate monitoring operation of a low-power memory device, for example, by implementing a loopback network (e.g., datapath) that enables a targeted low-power memory device to transmit loopback signals to an output pin.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. In other embodiments, the memory device 10 may be or may include a low-power memory device, such as a low-power double data rate (LPDDR) synchronous dynamic random access memory (SRAM) device of various"

types. These types may include, among others, a low-power double data rate type four synchronous dynamic random access memory (LPDDR4 SDRAM or LPDDR4X SDRAM), a low-power double data rate type five synchronous dynamic random access memory (LPDDR5 SDRAM), or other types of low-power memory devices.

The memory device 10 may include a number of memory banks 12. The memory banks 12 may be LPDDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. Various other configurations, organization and sizes of the memory banks 12 on the memory device 10 may be utilized depending on the application and design of the overall system and the type of memory employed.

The memory device 10 may include a command interface 14 and an input/output (I/O) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary/bar clock signal (Clk_c). The positive clock edge for DDR refers to the point where the rising true clock signal Clk_t/crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, as discussed below, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n)

from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the datapath 46, which includes a plurality of bi-directional data buses. Data I/O signals, generally referred to as DQ signals, are generally transmitted and received in one or more bi-directional data buses. For certain memory devices, such as a LPDDR5 SDRAM memory device, the I/O signals may be divided into upper and lower bytes. For instance, for a x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, certain memory devices, such as LPDDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the DQS signals may be provided as a differential pair of data strobe signals (DQS_t/ and DQS_c) to provide differential pair signaling during reads and writes. For certain memory devices, such as a LPDDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance. As discussed below, in some embodiments, the DQS signals may be divided into multiple phases using a multi-phase generator circuit (MPGC) 50. In some embodiments, the multi-phase generator circuit 50 may be omitted from the memory device 10 with internal data signals using the same frequency as the incoming DQS signal.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the I/O pins.

In addition, a loopback data signal (LBDQ) and loopback strobe signal (LBDQS) may be provided to the memory device 10 through the I/O interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a data pin. This is generally intended to be used to monitor the data captured by the memory device 10 at the I/O interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device. Although loopback pins are illustrated in the embodiment (e.g., DDR5) memory device 10 of FIG. 1, in some embodiments (e.g., low-power versions) of the memory device 10, such pins and/or other features may not be available. For instance, when the memory device 10 is implemented as a low-power double-data rate type 5 (LPDDR5) device, loopback implementation may be not available as loopback I/O pins may be unavailable, loopback implementations may not be part of the standard used for the memory device 10, and/or for other reasons (e.g., space) that such loopback mechanisms may be impractical. Instead, as discussed below, a loopback implementation may be included for such devices to enable loopback monitoring without needing to add new loopback I/O pins.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
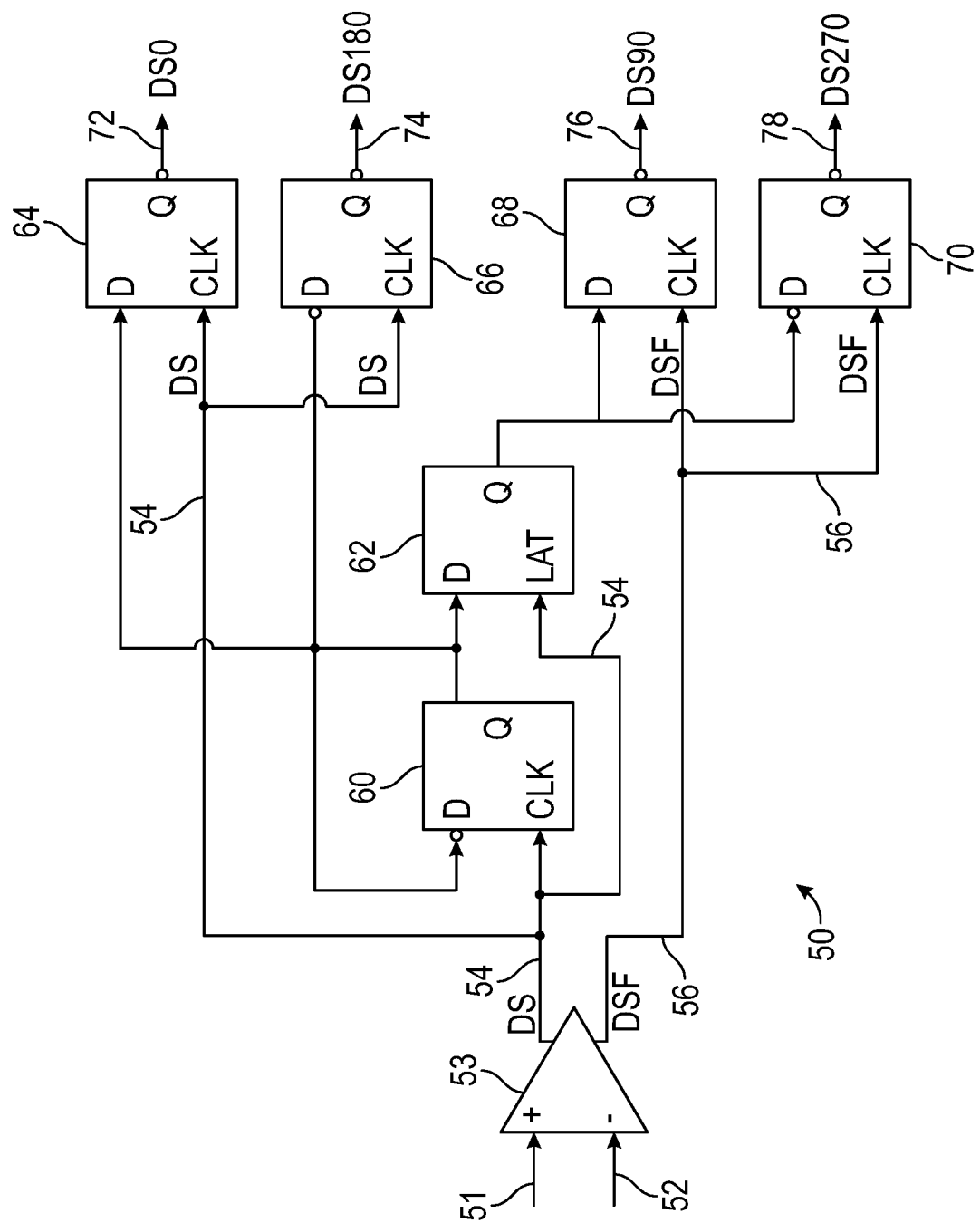
FIG. 2 is a schematic view of multi-phase generation circuitry used to receive a data strobe for a write command and to divide the data strobe into multiple phases, according to an embodiment of the present disclosure.

FIG. 2 illustrates an embodiment of the multi-phase generation circuitry 50 that may be implemented in the I/O interface 16. The multi-phase generation circuitry 50 receives an external write clock signal 51 (e.g., UDQS_t) that oscillates at the same speed as the clock and may be turned on or off. In some embodiments, as discussed previously, the write clock signal 51 may be accompanied by an external write clock bar/complementary signal 52 that is complementary to the write clock signal 51. These signals may be transmitted to an amplifier or input buffer 53 to provide an internal DS signal 54 and/or a complementary internal DS false signal 56. The amplifier 53 changes the power of the write clock signal 51 from an external level to a level appropriate for use in the memory device 10.

As illustrated, the multi-phase generation circuitry 50 uses the internal DS signal 54 and/or the internal DS false signal 56 to divide the signal out using a toggle flip-flop 60 that toggles its output each time a pulse occurs on the internal DS signal 54. The multi-phase generation circuitry 50 also includes a latch 62 that latches the output from the toggle flip-flop 60 to track falling edges of the internal DS signal 54. In other words, the toggle flip-flop 60 sets a rising mode that causes changes of states in rising edge flip-flops 64 and/or 66 on rising edges of the internal DS signal 54. Moreover, the toggle flip-flop 60 and the latch 62 work together to set a falling mode that causes changes of state in falling edge flip-flops 68 and/or 70 during a falling edge of the internal DS signal 54.

First data strobe signal 72 corresponds to an output of the rising edge flip-flop 64. First data strobe signal 72 transitions high with every other rise of the write clock signal 51.

Second data strobe signal 74 corresponds to a rising edge flip-flop 66. Second data strobe signal 74 transitions high on rising edges of the write clock signal 51 between those causing the first data strobe signal 72 to go high. In other words, rising edges of the write clock signal 51 alternate between causing the first data strobe signal 72 and second data strobe signal 74 to go high.

Third data strobe signal 76 corresponds to an output of the falling edge flip-flop 68. Due to the use of the internal DS false signal 56, third data strobe signal 76 transitions high with every other falling edge of the write clock signal 51. Similarly, fourth data strobe signal 78 corresponds to an output of the falling edge flip-flop 70 and transitions high with the other alternating falling edges of the write clock signal 51. In other words, single-edges of signals 72, 74, 76, and 78 each would cause toggles at a frequency of one-fourth of the double data rate of the write clock signal 51. Additionally or alternatively, the frequency may be further divided to provide different frequencies relative to the internal DS signal 54. For example, additional flip-flops may be included to divide the first data strobe signal 72, second data strobe signal 74, third data strobe signal 76, and fourth data strobe signal 78 to each be one-eighth (or less) of the frequency of the internal DS signal 54. Alternatively, fewer flip-flops may be used to provide a division into two half-frequency signals rather than into four quarter-frequency signals.

Figure 3:
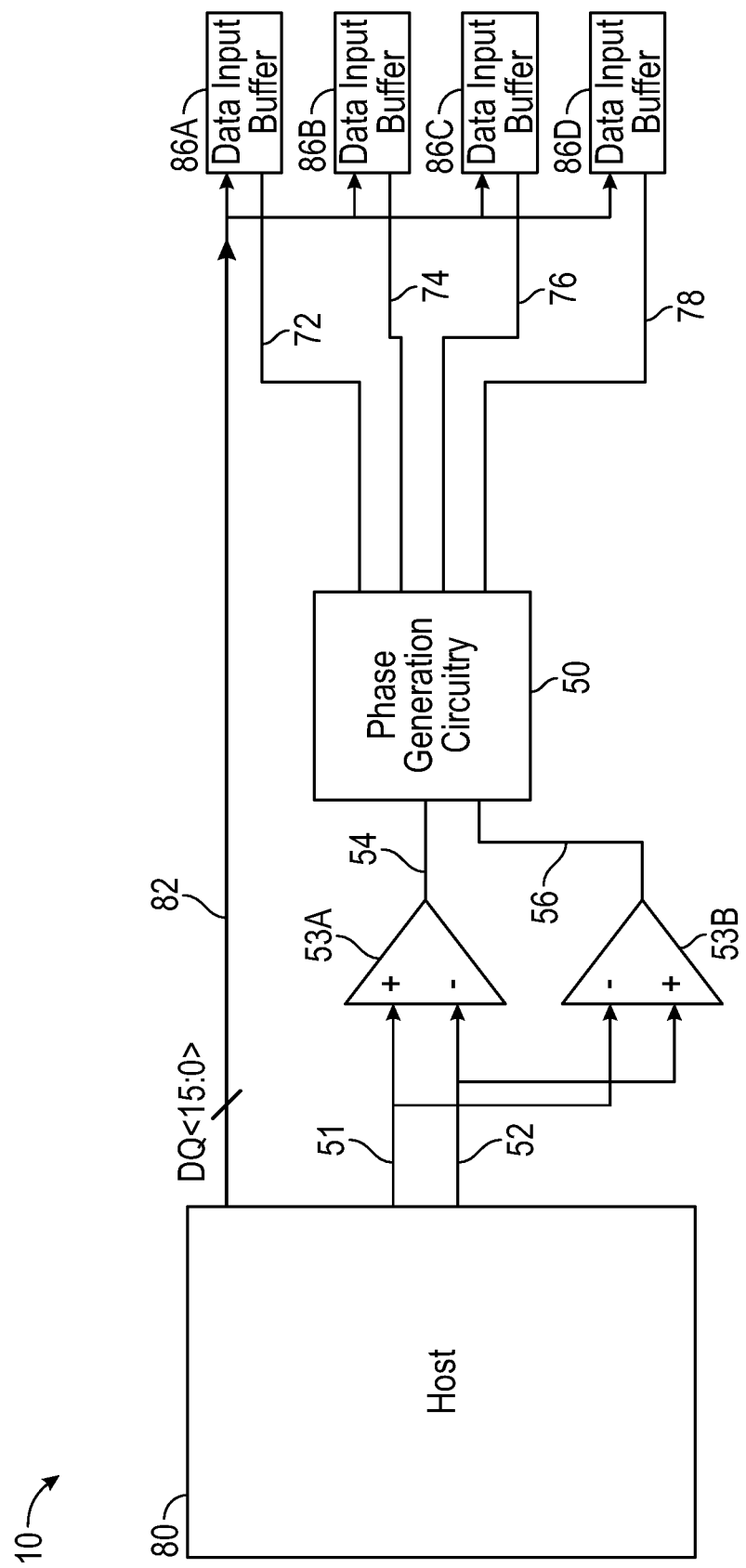
FIG. 3 is a schematic view of the memory device including the multi-phase generation circuitry of FIG. 2, according to an embodiment of the present disclosure.

FIG. 3 illustrates an embodiment of the memory device 10 including the multi-phase generation circuitry 50. As described above, the multi-phase generation circuitry 50 uses the internal DS signal 54 and/or the internal DS false signal 56 to divide the signal out. As depicted, the multi-phase generation circuitry 50 may include a pair of amplifiers 53A, 53B that receive the external write clock signal 51 and the external write clock bar/complementary signal 52 and generate the internal DS signal 54 and/or the complementary internal DS false signal 56. For instance, the pair of amplifiers 53A, 53B may be part of the input buffer 53 of FIG. 2 or may be used in place of the input buffer 53 of FIG. 2. Data signals may be transmitted by an external device, such as a host device 80 (e.g., processor) and written to the memory device 10. In certain embodiments, the memory device 10 may include input buffers 86 (referred to individually as input buffer 86A, 86B, 86C, 86D). Each input buffer 86 may receive the data signal 82 and a corresponding data strobe signal from the phase generation circuitry 50. For example, as depicted in the illustrated embodiment, the data input buffer 86A may receive the first data strobe signal 72 and may latch data from the data signal 82, the data input buffer 86B may receive the second data strobe signal 74, the data input buffer 86C may receive the third data strobe signal 76, and the data input buffer 86B may receive the fourth data strobe signal 78. The data buffers 86 may exist for each DQ. Thus, a first group of data input buffers 86 may receive a data signal from DQ0 while a second group of data input buffers 86 may receive a different data signal from DQ1 and so forth. Furthermore, as illustrated, the memory device 10 may include 16 DQs, but some embodiments of the memory device 10 may include any other number (e.g., 2, 4, 8, or more) DQs. Regardless, each DQ has a number of input buffers equal to how many phases the DQS is divided into by the multi-phase generation circuitry 50. For instance, the illustrated DQs each have 4 data input buffers 86, but some embodiments may include any other number of input buffers 86.

Figure 4:
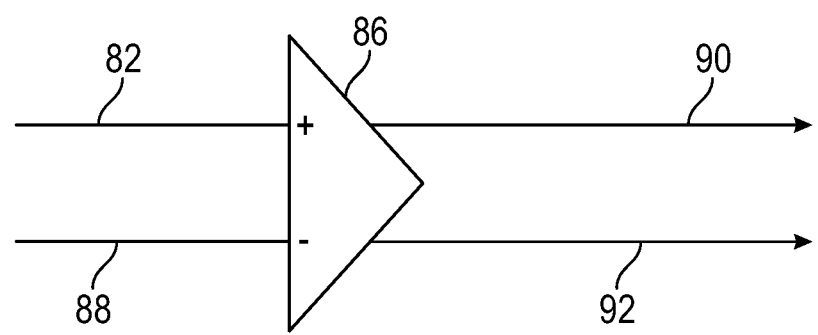
FIG. 4 is a schematic view of an example embodiment of a data input buffer, according to an embodiment of the present disclosure.

With the foregoing in mind, FIG. 4 is an example embodiment of the data input buffer 86. The data input buffer 86 may include a differential amplifier. However, the data input buffer 86 may be a single-ended signal. Accordingly, the data input buffer 86 may receive the data signal 82 for the corresponding DQ at a positive input terminal of the data input buffer 86 and may receive a reference voltage 88 at the negative/inverting input terminal. Using the single-ended data signal 82 and the reference voltage 88, the data input buffer 86 may output a differential signal, referred to herein as a true output signal 90 and a bar/complementary output signal 92. The memory device 10 may transmit the true output signal 90 to a write datapath. Additionally or alternatively, the memory device 10 may utilize the bar/complementary output signal 92 in a command bus training (CBT) mode. The CBT mode is a JEDEC-defined feature used to train some memory devices (e.g., DDR5 devices) for high-frequency operation. During the CBT mode, the DQ input data (e.g., write data from the host device) is output from the data input buffer 86. As discussed below, the memory device 10 may utilize the bar/complementary output signal 92 as a portion of a loopback datapath without adding much circuitry by reusing the CBT output path for looping back in a low-power memory device. In certain embodiments, in addition to setting the CBT mode, a host device may also enable loopback entry using a vendor-specific command to enable loopback monitoring.

Figure 5:
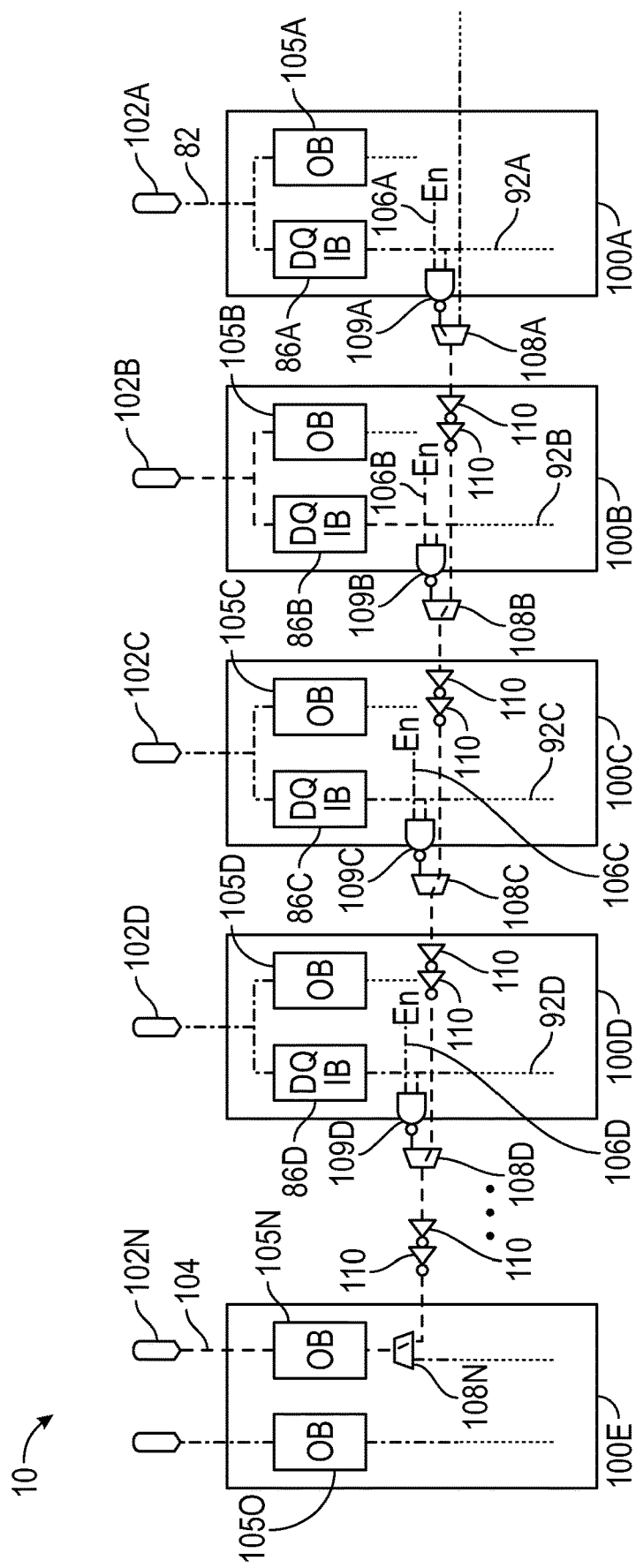
FIG. 5 is a block diagram of a memory system having memory devices coupled in a loopback network, according to an embodiment of the present disclosure.

To help illustrate, an example embodiment of the memory device 10 includes multiple DQ circuitries 100A, 100B, 100C, 100D, and 100E coupled together to implement a loopback system as depicted in FIG. 5. The DQ circuitries 100A, 100B, 100C, 100D, and 100E each respectively include DQs 102A, 102B, 102C, and 102D that may be used to transfer data within the memory device 10. For instance, the DQs 102A, 102B, 102C, and 102D may receive data. For example, the DQs 102A, 102B, 102C, and 102D may be input pins or data lines connected to input pins of the memory device 10. Likewise, the DQ 102N may be used to output data to the host device 80 as a read data strobe signal (RDQS) when the memory device 10 is operating in a loopback mode. Furthermore, while operating in the loopback mode, the memory device 10 may output a loopback data signal 104 that includes the data input via the DQ 102A.

The DQ circuitries 100A, 100B, 100C, and 100D each respectively include respective data input buffers 86A, 86B, 86C, and 86D that may be used to buffer input data. Furthermore, the DQ circuitries 100A, 100B, 100C, and 100D each respectively include respective output buffers 105A, 105B, 105C, and 105D. The DQ circuitry 100E includes output buffers 105N and 105O.

To facilitate loopback monitoring in the memory device 10, the DQ circuitries 100A, 100B, 100C, 100D, and 100E may operate in a loopback mode during loopback operations. In particular, the data input buffer 86A may operate in a command bus training (CBT) sub-mode such that the DQ circuitry 100A generates and outputs a loopback signal corresponding to the data signal 82 received at the DQ. For example, the input buffer 86A may output the loopback signal as the bar/complementary output signal 92. Additionally, the DQ circuitries 100B, 100C, and 100D may each operate in a bypass mode such that they pass the loopback signal without altering the loopback signal by outputting an additional loopback signal or by interrupting transmission of the loopback signal. The host device 80 and/or circuitry (e.g., the command interface 14, the command decoder 32, and/or the I/O interface 16) may activate (e.g., enable) the CBT mode and the bypass mode in the memory devices 10 to permit a memory device 10 to transmit a loopback signal through the loopback datapath without interruption. For instance, the host device 80 and/or the circuitry may send control signals to multiplexers 108A, 108B, 108C, and 108D to route the bar/complementary signal 92 as the loopback signal to the DQ 102N when the DQ circuitry 100A is to be monitored. Additionally, in some embodiments, the host device 80 may transmit a semi-conductor vendor-specific command to cause the loopback monitoring.

In some embodiments, during a loopback operation, any of DQs 102A, 102B, 102C, or 102D may be targeted for operational monitoring. For example, during a first loopback operation, the DQ 102A may be targeted for operational monitoring while the DQ 102D may be targeted during a second (e.g., subsequent) loopback operation.

The signals to the multiplexers 108 may be gated such that the multiplexers 108 may not transmit the outputs of the respective input buffers 86 to adjacent DQ circuitries unless such transmissions have been enabled for the specific DQ circuitry 100. For instance, the DQ circuitries 100A, 100B, 100C, and 100D may respectively include a NAND gate 109A, 109B, 109C, and 109D (collectively referred to as a "NAND gates 109"). The NAND gates 109 may each respectively receive an enable signal 106 to enable its output from its data input buffer 86 to its respective multiplexer 108. For instance, the DQ circuitry 100A utilizes an enable signal 106A to enable the NAND gate 109A to allow the multiplexer 108A to output data from the data input buffer 86A to the DQ circuitry 100B when the DQ circuitry 100A is to be monitored. Similarly, the DQ circuitry 100B utilizes an enable signal 106B to enable the NAND gate 109B to allow the multiplexer 108B to output data from the data input buffer 86B to the DQ circuitry 100C when the DQ circuitry 100B is to be monitored. Likewise, the DQ circuitry 100C utilizes an enable signal 106C to enable the NAND gate 109C to allow the multiplexer 108C to output data from the data input buffer 86C to the DQ circuitry 100D when the DQ circuitry 100C is to be monitored. Moreover, the DQ circuitry 100D utilizes an enable signal 106D to enable the NAND gate 109D to allow the multiplexer 108D to output data from the data input buffer 86D to the adjacent DQ circuitry (e.g., the DQ circuitry 100E) when the DQ circuitry 100D is to be monitored.

It should be appreciated that the depicted memory device 10 is merely intended to be illustrative and not limiting. For example, in some embodiments, DQ circuitries 100 may include or use more or fewer logic gates and/or circuitry. For instance, the memory device 10 may include inverters 110 (e.g., inverting amplifiers) to amplify signals and/or ensure proper logic polarity.

To enable monitoring of a specific DQ 102 and/or DQ circuitry 100, the appropriate enable signal 106 and control signals for the multiplexers 108 are to be asserted. For instance, when the DQ 102A/DQ circuitry 100A is to be monitored, CBT mode is turned on for the data input buffer 86A to cause the bar/complementary signal 92A to be output from the data input buffer 86A. Also, the enable signal 106A is asserted to cause the NAND gate 109A to output bar/complementary signal 92A from the data input buffer 86A. A control signal is also sent to the multiplexer 108A to cause the multiplexer 108A to output the bar/complementary signal 92A. Other control signals are sent to the multiplexers 108B, 108C, and 108D to output the bar/complementary signal 92A to the output buffer 105N and eventually out the DQ 102N (as RDQS) as the loopback data signal 104.

When the DQ 102B/DQ circuitry 100B is to be monitored, CBT mode is turned on for the data input buffer 86B to cause bar/complementary signal 92B to be output from the data input buffer 86B. Also, enable signal 106B is asserted to cause the NAND gate 109B to output bar/complementary signal 92B from the data input buffer 86B. A control signal is also sent to the multiplexer 108B to cause the multiplexer 108B to output the bar/complementary signal 92B. Other control signals are sent to the multiplexers 108C and 108D to output the bar/complementary signal 92B to the output buffer 105N and eventually out the DQ 102N (as RDQS) as the loopback data signal 104.

When the DQ 102C/DQ circuitry 100C is to be monitored, CBT mode is turned on for the data input buffer 86C to cause bar/complementary signal 92C to be output from the data input buffer 86C. Also, enable signal 106C is asserted to cause the NAND gate 109C to output bar/complementary signal 92C from the data input buffer 86C. A control signal is also sent to the multiplexer 108C to cause the multiplexer 108C to output the bar/complementary signal 92C. Another control signal is sent to the multiplexer 108D to output the bar/complementary signal 92C to the output buffer 105N and eventually out the DQ 102N (as RDQS) as the loopback data signal 104.

When the DQ 102D/DQ circuitry 100D is to be monitored, CBT mode is turned on for the data input buffer 86D to cause bar/complementary signal 92D to be output from the data input buffer 86D. Also, enable signal 106D is asserted to cause the NAND gate 109D to output bar/complementary signal 92D from the data input buffer 86D. A control signal is also sent to the multiplexer 108D to cause the multiplexer 108D to output the bar/complementary signal 92D to the output buffer 105N and eventually out the DQ 102N (as RDQS) as the loopback data signal 104.

The timing and control of the enablement of the CBT mode, assertion of the enable signals 106, and the control signals to the coordinate the multiplexers 108 may be at least partially orchestrated by the host device 80. For instance, the host device 80 may initiate the signaling by setting a mode register (MR) and/or sending a command code that the command decoder 32 decodes to cause the memory device 10 to activate CBT for the appropriate DQ circuitry 100/data input buffer 86, send the appropriate enable signal 106, and send control signals to multiplexers 108 in accordance with the previously describe described functions.

Figure 6:
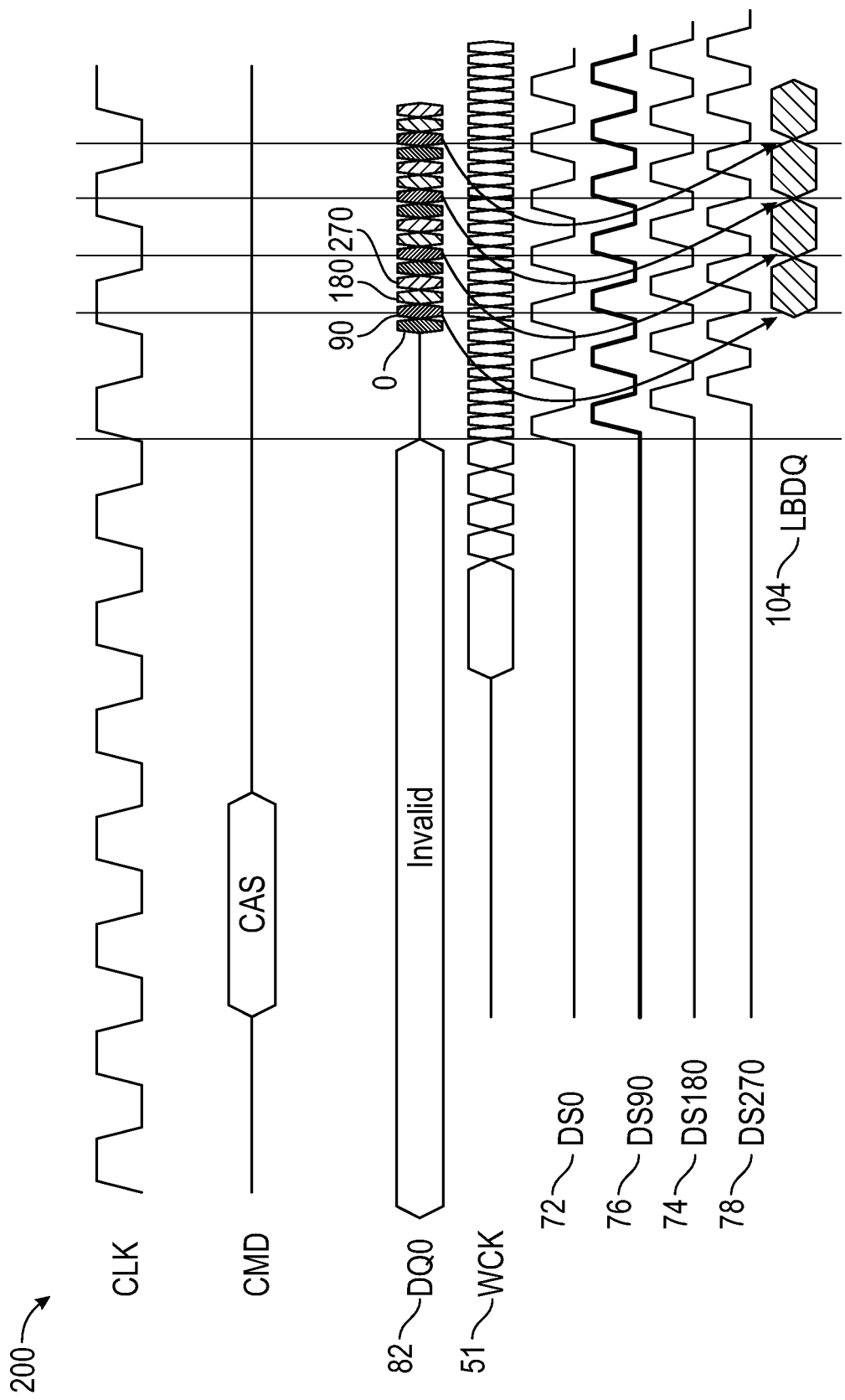
FIG. 6 is a timing diagram of a loopback signal in the memory device of FIG. 5, according to an embodiment of the present disclosure.

To help illustrate timing of such signals, a timing diagram 200 that includes signal waveforms present in the memory device 10, is shown in FIG. 6. As depicted, the timing diagram 200 includes the write clock signal 51, the data signal 82 at a respective DQ 102 (e.g., DQ0), the data strobe signals 72, 74, 76, 78, and the loopback data signal 104. The memory device 10 may generate one or more data strobe signals, such as the data strobe signals 72, 74, 76, and 78, based at least in part on the write clock signal 51. For example, the generation may be performed by down sampling and/or phase shifting the write clock signal 51 to facilitate reading a corresponding loopback data signal (e.g., the loopback data signal 104). To help illustrate, in the depicted example, the memory device 10 down samples the write clock signal 51 by a factor of four to generate the first data strobe signal 72, the second data strobe signal 74, the third data strobe signal 76 corresponding with the loopback data signal 114, and/or the fourth data strobe signal 78 as previously described.

In certain embodiments, the memory device 10 may generate one or more loopback data signals (e.g., the loopback data signal 104) based at least in part on a corresponding data signal (e.g., the data signal 82). To help illustrate, in the depicted example, the data signal 82 includes a stream of data aligned with the write clock signal 51. To facilitate monitoring, in some embodiments, the target memory device 10 may down sample the data signal 82 to generate one or more loopback data signals. To help illustrate, in the depicted example, the memory device 10 down samples the data signal 82 by a factor of four to generate corresponding loopback data signals 104 at a rate that is one-quarter of the clock signal 51. In other embodiments, the memory device 10 may generate loopback data signals by down sampling the data signal 82 by a different factor (e.g., two, eight, and so forth) or up sampling the data signal 82. Additionally or alternatively, the memory device 10 may generate loopback data signals 104 with the same frequency (e.g., without down-sampling or up-sampling) as a corresponding data signal.

In this manner, the memory device 10 targeted for operational monitoring may generate one or more target loopback signals 104 based at least in part on the loopback parameters. As described above, upon being set to the command bus training (CBT) mode, the memory device 10 may output the one or more target loopback signals 104, thereby enabling the one or more target loopback signals 104 to be output via a corresponding data pin (e.g., DQ 102N). Additionally, the host device 80 (e.g., a processor) may receive the one or more target loopback signals 104 and perform operational monitoring (e.g., diagnostics) on the memory device 10 based at least in part on the received loopback signals 104.

Thus, the technical effects of the present disclosure include facilitating monitoring of memory device operations, for example, by providing a loopback signal indicative of memory device operation for a low-power memory device. The techniques include methods of utilizing a command bus training mode to output the loopback signal via a data pin.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device comprising:
   a first data input (DQ) circuitry comprising an input buffer configured to generate a loopback data signal based at least in part on a data signal received at the first DQ circuitry when the device operates in a loopback mode, wherein the loopback mode comprises a command bus training mode of the device;
   a second DQ circuitry comprising an output buffer configured to receive the loopback data signal from the first DQ circuitry and to output the loopback data signal via a data pin; and
   a mode register used to receive an indication, from a host device, to set the device in the loopback mode and to indicate a target for monitoring in the loopback mode.

2. The device of claim 1, wherein the second DQ circuitry comprises a multiplexer configured to select the received loopback data signal from first DQ circuitry when the device operates in the loopback mode.

3. The device of claim 1, wherein the first DQ circuitry comprises a multiplexer configured to output the loopback data signal when the loopback mode is active and the first DQ circuitry is indicated as a target of monitoring via the loopback mode.

4. The device of claim 1, comprising a third DQ circuitry configured to receive the loopback data signal from the first DQ circuitry and to transmit the loopback data signal to the second DQ circuitry.

5. The device of claim 4, wherein the third DQ circuitry comprises a second input buffer configured to generate a second loopback data signal based at least in part on a second data signal received at the second DQ circuitry when the loopback mode is active and the third DQ circuitry is indicated as a target of monitoring via the loopback mode.

6. The device of claim 5, wherein the third DQ circuitry comprises a multiplexer configured to select between transmitting the loopback data signal and the second loopback data signal to the second DQ circuitry.

7. The device of claim 1, wherein the device comprises a low-power double data rate (LPDDR) memory device.

8. A method for operating a low-power memory device to facilitate a monitoring operation, comprising:
   receiving, at the low-power memory device, a data signal from a host device via a data input (DQ) circuitry;
   initiating a command bus training mode;
   based on initiating the command bus training mode, generating a loopback data signal as an output of a data input buffer of the DQ circuitry based at least in part on the data signal; and
   routing the loopback data signal from the DQ circuitry through one or more other DQ circuitries to the host device.

9. The method of claim 8, wherein routing the loopback data signal comprises using a multiplexer of the DQ circuitry to select to transmit the loopback data signal to an additional DQ circuitry of the low-power memory device.

10. The method of claim 9, comprising receiving, at the additional DQ circuitry, the loopback data signal, wherein routing the loopback data signal comprises transmitting the loopback data signal to the host device via a data pin of the additional DQ circuitry.

11. The method of claim 10, wherein the data pin is associated with a read data strobe signal.

12. The method of claim 10, wherein routing the loopback data signal comprises routing the loopback data signal through a third DQ circuitry between the DQ circuitry and the additional DQ circuitry.

13. The method of claim 12, wherein routing the loopback data signal through the third DQ circuitry comprises sending a control signal to a multiplexer of the third DQ circuitry to transmit the loopback data signal from the DQ circuitry to the additional DQ circuitry rather than transmitting from a data input buffer of the third DQ circuitry.

14. The method of claim 8, comprising transmitting an enable signal to the DQ circuitry as a target of the monitoring operation.

15. The method of claim 14, comprising using the enable signal to enable the loopback data signal to be transmitted through a NAND gate of the DQ circuitry and out of the DQ circuitry.

16. The method of claim 8, comprising receiving a vendor-specific command at the low-power memory device to initiate a loopback mode, wherein generating the loopback data signal is based at least in part on receiving the vendor-specific command and initiating the command bus training mode.

17. A device, comprising:
a plurality of data input (DQ) circuitries, each comprising:
an input buffer configured to:
receive a data signal externally; and
generate a loopback data signal based at least in part on the data signal when the device is in a command bus training mode; and
a multiplexer configured to select a transmitted loopback data signal as a selection between the respective loopback data signal from the respective input buffer and an adjacent loopback data signal received from an adjacent DQ circuitry of the plurality of DQ circuitries; and
an output circuitry configured to output the transmitted loopback data signal outside the device.

18. The device of claim 17, wherein the device comprises a low-power double data rate (LPDDR) memory device.

19. The device of claim 17, wherein the output circuitry comprises a DQ pin configured as a read data strobe (RDQS).

* * * * *